United States Patent
Yoo et al.

(10) Patent No.: US 10,319,706 B2
(45) Date of Patent: Jun. 11, 2019

(54) MICRO-LED MODULE AND METHOD FOR FABRICATING THE SAME

(71) Applicant: LUMENS CO., LTD., Yongin-si, Gyeonggi-do (KR)

(72) Inventors: Taekyung Yoo, Yongin-si (KR); Daewon Kim, Yongin-si (KR); Seongbok Yoon, Yongin-si (KR); Yelim Won, Yongin-si (KR); Myungji Moon, Yongin-si (KR); Hanbeet Chang, Yongin-si (KR); Yongpil Kim, Yongin-si (KR); Jaesoon Park, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 15/818,738

(22) Filed: Nov. 20, 2017

(65) Prior Publication Data
US 2018/0233496 A1    Aug. 16, 2018

(30) Foreign Application Priority Data

Feb. 10, 2017 (KR) .......................... 10-2017-0018811
Mar. 10, 2017 (KR) .......................... 10-2017-0030833

(51) Int. Cl.
*H01L 25/16* (2006.01)
*H01L 23/00* (2006.01)
(Continued)

(52) U.S. Cl.
CPC ............ *H01L 25/167* (2013.01); *H01L 24/03* (2013.01); *H01L 24/05* (2013.01); *H01L 24/11* (2013.01); *H01L 24/13* (2013.01); *H01L 24/16* (2013.01); *H01L 24/81* (2013.01); *H01L 33/007* (2013.01); *H01L 33/38* (2013.01); *H01L 27/092* (2013.01); *H01L 27/156* (2013.01); *H01L 33/32* (2013.01); *H01L 33/42* (2013.01); *H01L 33/62* (2013.01); *H01L 2224/0345* (2013.01); *H01L 2224/03912* (2013.01); *H01L 2224/0401* (2013.01); *H01L 2224/05082* (2013.01);
(Continued)

(58) Field of Classification Search
CPC .............................. H01L 25/167; H01L 24/03
USPC .......................................................... 257/91
See application file for complete search history.

(56) References Cited

U.S. PATENT DOCUMENTS

| | | | |
|---|---|---|---|
| 5,829,125 A | 11/1998 | Fujimoto et al. | |
| 6,281,524 B1 * | 8/2001 | Yamamoto | H01L 24/24 257/99 |

(Continued)

FOREIGN PATENT DOCUMENTS

| | | | |
|---|---|---|---|
| JP | 63-78470 A | 4/1988 | |
| JP | 5-110241 A | 4/1993 | |

(Continued)

*Primary Examiner* — Igwe U Anya
(74) *Attorney, Agent, or Firm* — Mei & Mark LLP (57) ABSTRACT

A method for fabricating a micro-LED module is disclosed. The method includes: preparing a micro-LED including a plurality of electrode pads and a plurality of LED cells; preparing a submount substrate including a plurality of electrodes corresponding to the plurality of electrode pads; and flip-bonding the micro-LED to the submount substrate through a plurality of solders located between the plurality of electrode pads and the plurality of electrodes. The flip-bonding includes heating the plurality of solders by a laser.

18 Claims, 11 Drawing Sheets

(51) Int. Cl.
*H01L 33/38* (2010.01)
*H01L 33/00* (2010.01)
*H01L 33/62* (2010.01)
*H01L 33/32* (2010.01)
*H01L 33/42* (2010.01)
*H01L 27/092* (2006.01)
*H01L 27/15* (2006.01)

(52) U.S. Cl.
CPC ............ *H01L 2224/05147* (2013.01); *H01L 2224/05166* (2013.01); *H01L 2224/1146* (2013.01); *H01L 2224/1181* (2013.01); *H01L 2224/11849* (2013.01); *H01L 2224/1357* (2013.01); *H01L 2224/13147* (2013.01); *H01L 2224/13611* (2013.01); *H01L 2224/13639* (2013.01); *H01L 2224/16145* (2013.01); *H01L 2224/81191* (2013.01); *H01L 2224/81224* (2013.01); *H01L 2224/81365* (2013.01); *H01L 2224/81815* (2013.01); *H01L 2224/81986* (2013.01); *H01L 2924/014* (2013.01); *H01L 2933/0066* (2013.01)

(56) References Cited

U.S. PATENT DOCUMENTS

| | | | |
|---|---|---|---|
| 2013/0270230 A1* | 10/2013 | Cheung | H01L 24/75 219/121.6 |
| 2015/0340346 A1 | 11/2015 | Chu et al. | |
| 2016/0049381 A1* | 2/2016 | Ryu | H01L 24/81 438/125 |
| 2017/0092819 A1* | 3/2017 | Matsuura | H01L 33/486 |
| 2018/0204973 A1* | 7/2018 | Jeung | H01L 33/00 |

FOREIGN PATENT DOCUMENTS

| | | |
|---|---|---|
| JP | 7-37911 A | 2/1995 |
| JP | 2002-164368 A | 6/2002 |
| JP | 2006-140295 A | 6/2006 |
| JP | 2012-504856 A | 2/2012 |
| JP | 2014-225586 A | 12/2014 |
| KR | 2003-0075487 A | 9/2003 |
| KR | 10-2012-0080306 A | 7/2012 |

* cited by examiner

MICRO-LED MODULE AND METHOD FOR FABRICATING THE SAME

BACKGROUND OF THE INVENTION

1. Field of the Invention

The present invention relates to a method for fabricating a micro-LED module by flip-bonding a micro-LED including a light-transmitting substrate to a submount substrate having a coefficient of thermal expansion significantly different from the micro-LED.

2. Description of the Related Art

Displays using micro-LED modules are known. Each of the micro-LED modules is fabricated by flip-bonding a micro-LED including a plurality of LED cells to a submount substrate.

Generally, the micro-LED includes a light-transmitting sapphire substrate and a gallium nitride semiconductor light emitting unit formed on the light-transmitting sapphire substrate and having a plurality of LED cells. The semiconductor light emitting unit includes an exposed area of an n-type semiconductor layer formed by etching and the plurality of LED cells are arranged in a matrix on the exposed area of the n-type semiconductor layer. Each of the LED cells includes an n-type semiconductor layer, an active layer, and a p-type conductive semiconductor layer. A p-type electrode pad is disposed on the p-type conductive semiconductor layer of each LED cell. An n-type electrode pad is disposed on the exposed area of the n-type semiconductor layer.

The submount substrate includes a plurality of electrodes disposed corresponding to the electrode pads of the micro-LED. The micro-LED is flip-bonded to the mount substrate through solder bumps so that the electrode pads of the micro-LED are connected to the electrodes of the submount substrate. For flip-bonding of the micro-LED to the submount substrate, a solder constituting at least a portion of each solder bump should be heated to a temperature around its melting point. However, there are large differences in expansion and contraction strains between the Si-based submount substrate and the sapphire substrate upon heating and cooling during flip-bonding because the coefficient of thermal expansion of the Si-based submount substrate is significantly different from that of the sapphire substrate. These differences cause a serious misalignment between the submount substrate and the micro-LED. Due to this misalignment, the electrode pads of the micro-LED are not connected to the electrodes of the submount substrate, and in a more severe case, the electrode pads of the micro-LED are misconnected to the electrodes of the submount substrate, causing serious detects, such as electrical shorting.

For example, the sapphire substrate on which the micro-LED is based has a coefficient of thermal expansion of 7.6 $\mu mm^{-1}K$, and the Si-based submount substrate has a coefficient of thermal expansion of 2.6 $\mu mm^{-1}K$. That is, the coefficient of thermal expansion of the sapphire substrate amounts to about 2.5 times that of the Si-based submount substrate. The coefficients of thermal expansion of the substrates depend on their temperature. The use of a high melting point solder for the bumps requires a high flip-bonding temperature. In this case, the large difference in coefficient of thermal expansion between the sapphire substrate and the submount substrate causes a misalignment between the micro-LED and the submount substrate, making it difficult to bond the micro-LED to the submount substrate.

For example, when the melting point (260° C.) of the solder is set as a bonding temperature, an misalignment of 5 to 6 $\mu m$ is caused per 1 cm of the substrates, making it substantially impossible to use the solder in a process where a bonding precision of 2 $\mu m$ is required, like flip-bonding of the micro-LED.

Thus, there exists a need in the art for a solution to the problem of misalignment caused by a difference in coefficient of thermal expansion between a sapphire substrate of a micro-LED and a submount substrate when the micro-LED is flip-bonded to the submount substrate.

PRIOR ART DOCUMENTS

Patent Documents (Patent Document 1) Korean Patent No. 10-1150861 (issued on May 22, 2012)
(Patent Document 2) Korean Patent No. 10-0470904 (issued on Jan. 31, 2005)

SUMMARY OF THE INVENTION

The present invention has been made in view of the above problems and it is an object of the present invention to provide a method for fabricating a micro-LED module that is free from problems associated with misalignment caused by a difference in coefficient of thermal expansion between substrates.

A method for fabricating a micro-LED module according to one aspect of the present invention includes: preparing a micro-LED including a plurality of electrode pads and a plurality of LED cells; preparing a submount substrate including a plurality of electrodes corresponding to the plurality of electrode pads; and flip-bonding the micro-LED to the submount substrate through a plurality of solders located between the plurality of electrode pads and the plurality of electrodes, wherein the flip-bonding includes heating the plurality of solders by a laser.

According to one embodiment, the flip-bonding includes locally heating the plurality of solders by a plurality of laser beams.

According to one embodiment, the individual electrode pads are formed on the LED cells and the flip-bonding includes heating the solders located between the individual electrode pads and the submount substrate by a laser sequentially passing through the LED cells and the individual electrode pads.

According to one embodiment, the individual electrode pads are transmissive to the laser.

According to one embodiment, the individual electrode pads include cavities through which the laser passes.

According to one embodiment, the micro-LED includes a common electrode pad formed on the surface of an epilayer around the plurality of LED cells and the flip-bonding includes heating a solder located between the common electrode pad and the submount substrate by the laser sequentially passing through the epilayer and the common electrode pad.

According to one embodiment, the common electrode pad is transmissive to the laser.

According to one embodiment, the common electrode pad includes a cavity through which the laser passes.

According to one embodiment, the flip-bonding includes heating the plurality of solders by a plurality of laser beams passing vertically through the micro-LED from one side to the other side of the micro-LED and the plurality of laser beams include laser beams passing through the substrate and the epilayer in which none of the LED cells are present and laser beams passing through the substrate and the epilayer in which the LED cells are present.

According to one embodiment, the flip-bonding includes heating the plurality of solders by a plurality of laser beams passing vertically through the micro-LED from one side to the other side of the micro-LED and focusing lenses are used to focus the laser beams on the corresponding solders.

According to one embodiment, the flip-bonding includes placing a plurality of laser beam irradiation units in an arrangement corresponding to an arrangement of the plurality of solders at one side of the micro-LED before heating the plurality of solders by a plurality of laser beams passing vertically through the micro-LED from one side to the other side of the micro-LED.

According to one embodiment, a plurality of laser beam irradiation units are placed in an arrangement corresponding to an arrangement of the plurality of solders at one side of the micro-LED before heating the plurality of solders by a plurality of laser beams passing vertically through the micro-LED from one side to the other side of the micro-LED and each of the plurality of laser beam irradiation units includes an optical guide connected to a laser source, a collimator for making laser beams entering through the optical guide parallel to each other, a beam controller for controlling the cross-sectional size of the parallel laser beams, and a focusing lens for focusing the parallel laser beams whose cross-sectional size is controlled on the corresponding solders.

According to one embodiment, the flip-bonding may include matching a plurality of laser beam irradiation units to the plurality of solders in a 1:1 ratio such that the plurality of solders are heated by laser beams irradiated from the plurality of laser beam irradiation units.

According to one embodiment, the flip-bonding may include matching a plurality of laser beam irradiation units to the plurality of solders in a 1:n (where n is a natural number equal to or greater than 2) ratio such that two or more of the solders are heated by laser beams irradiated from each of the laser beam irradiation units moving in a linear or zigzag pattern.

According to one embodiment, the flip-bonding may include matching two or more laser beam irradiation units to two or more solder groups such that each of the laser beam irradiation units heats the solders in the corresponding solder group.

A micro-LED module according to a further aspect of the present invention includes: a micro-LED including a substrate, an epilayer including a plurality of LED cells, second conductive individual electrode pads disposed on the plurality of LED cells, and a first conductive common electrode disposed around the plurality of LED cells; a submount substrate including a plurality of electrodes corresponding to the individual electrode pads and the common electrode pad; and solders located between the electrodes and the individual and common electrode pads, wherein the solders are heated by a laser and are then hardened so that the electrodes are connected to the individual electrode pads and the common electrode pad.

According to one embodiment, the substrate, the epilayer, the individual electrode pads, and the common electrode pad are transmissive to laser beams such that the solders are heated by the laser passing through the micro-LED from one side to the other side of the micro-LED.

According to one embodiment, the individual electrode pads may be made of a laser beam-transmitting material.

According to one embodiment, the individual electrode pads may include cavities through which the laser passes.

According to one embodiment, the common electrode pad may be made of a laser beam-transmitting material.

According to one embodiment, the common electrode pad may include a cavity through which the laser passes.

The micro-LED module of the present invention is constructed such that laser beams are locally irradiated onto the solders located between the micro-LED and the submount substrate to rapidly melt the solders. Due to this construction, no substantial heat is applied to the laser beam-transmitting micro-LED and the submount substrate located beyond the reach of laser beams. Therefore, the present invention can provide a solution to the problem of misalignment caused by a difference in coefficient of thermal expansion between the micro-LED and the submount substrate.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

First and second embodiments of the present invention will now be described with reference to the accompanying drawings. The drawings and the examples are simplified and exemplified such that those skilled in the art can readily understand the present invention, and therefore, they should not be construed as limiting the scope of the present invention.

First and second embodiments of the present invention provide a method for fabricating a micro-LED module by flip-bonding a micro-LED to a submount substrate as an active matrix substrate. According to the first and second embodiments of the present invention, first, a Si-based submount substrate including an electric circuit and electrodes is prepared and a micro-LED based on a sapphire substrate is constructed.

The construction of a micro-LED, the formation of bumps, and flip-bonding of the micro-LED to a submount substrate in accordance with the first and second embodiments of the present invention will be explained sequentially below.

First Embodiment

Construction of Micro-LED

With reference to FIGS. 1a to 1e, an explanation will be given regarding a method for constructing a micro-LED.

Figure 1A:
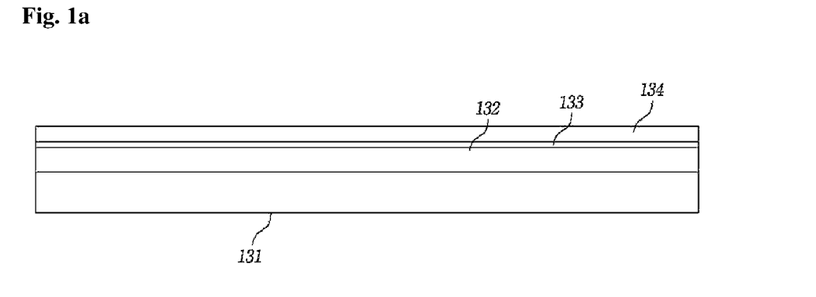
FIGS. 1a to 1e illustrate a process for constructing a micro-LED in accordance with a first embodiment of the present invention.

First, an epilayer including an n-type semiconductor layer 132, an active layer 133, and a p-type semiconductor layer 134 is formed on the primary surface of a light-transmitting sapphire substrate 131, as illustrated in FIG. 1a. The light-transmitting sapphire substrate 131 has a coefficient of thermal expansion of 7.6 $\mu mm^{-1}K$.

Figure 1B:
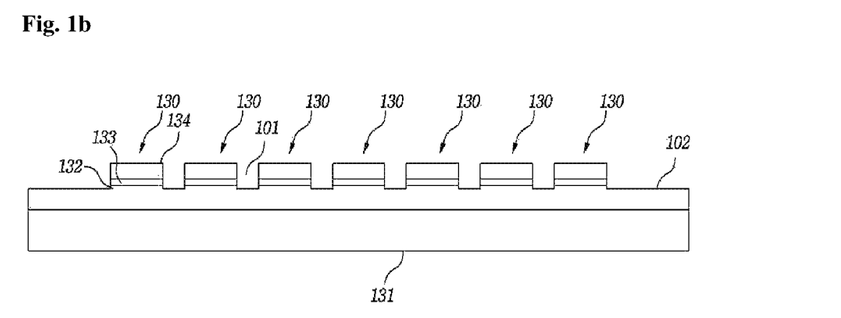

Next, the epilayer is etched to a predetermined depth using a mask pattern to form trenches 101 and an exposed area 102 of the n-type semiconductor layer 132, as illustrated in FIG. 1b. As a result of this etching, a plurality of LED cells 130 are formed. The plurality of LED cells 130 are separated by the trenches 101 and are surrounded by the exposed area 102 of the n-type semiconductor layer 132. Each of the LED cells 130 has a structure in which the active layer 133 and the p-type semiconductor layer 134 are formed on the n-type semiconductor layer 132. Although not illustrated, a buffer layer may be formed between the n-type semiconductor layer 132 and the sapphire substrate 131. Other semiconductor layers having specific functions may be interposed between the n-type semiconductor layer 132 and the active layer 133, between the active layer 133 and the p-type semiconductor layer 134, and on the exposed surface of the p-type semiconductor layer 134. Since the epilayer and the light-transmitting sapphire substrate 131 are transmissive to laser beams, the LED cells 130 are also transmissive to laser beams.

Figure 1C:
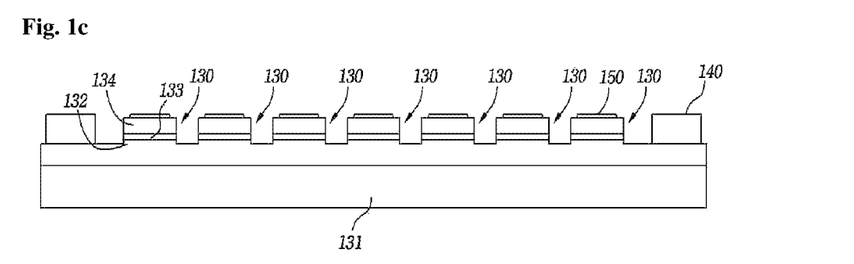

Next, a laser-transmitting p-type electrode pad 150 is formed on each of the p-type semiconductor layers 134 of the LED cells 130 and a laser-transmitting n-type electrode pad 140 is formed at the periphery of the exposed area 102 of the n-type semiconductor layer 132, as illustrated in FIG. 1c. The p-type electrode pad 150 and the n-type electrode pad 140 are designed to have different thicknesses. This design compensates for the step height between the p-type semiconductor layer 134 and the n-type semiconductor layer 132 and allows the surface of the p-type electrode pad 150 to which a solder is to be bonded to lie at the same level as the surface of the n-type electrode pad 140 to which a solder is to be bonded.

Figure 1D:
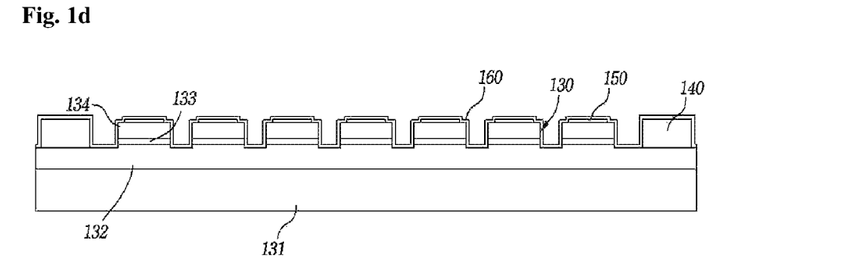

Next, a passivation layer 160 is formed so as to cover the LED cells 130 and the exposed area 102 of the n-type semiconductor layer 132, as illustrated in FIG. 1d.

Figure 1E:
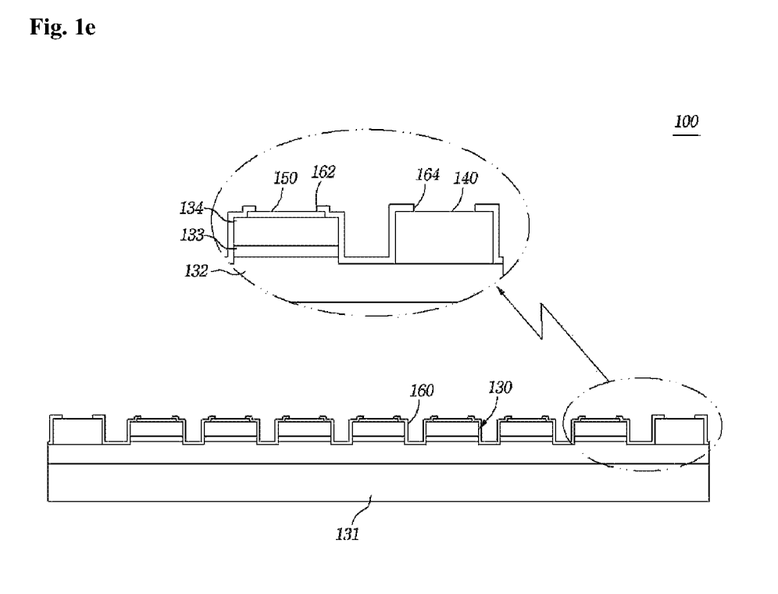

Next, first holes 162 through which the p-type electrode pads 150 are exposed and a second hole 164 through which the n-type electrode pad 140 is exposed are formed, as illustrated in FIG. 1e. The first holes 162 and the second hole 164 may be formed by etching using a mask pattern. In this embodiment, the passivation layer 160 is formed to substantially the same thickness along the cross-sectional profile of the LED cells 130 such that the width and depth of the trenches 101 between the neighboring LED cells 130 decrease but the trenches remain unremoved. Alternatively, the passivation layer 160 may completely fill the trenches 101.

Preparation of Submount Substrate and Formation of Bumps

Figure 2:
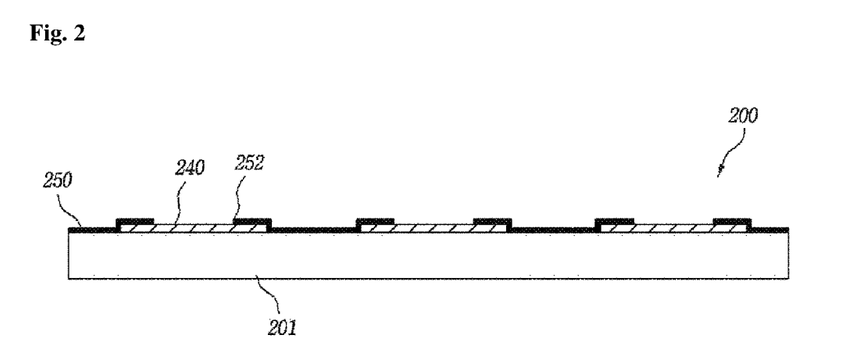
FIG. 2 is a partial cross-sectional view illustrating a submount substrate used in a first embodiment of the present invention.

Referring first to FIG. 2, a Si-based submount substrate 200 having a size of about 15,000 $\mu m \times 10,000$ $\mu m$ is prepared, followed by the formation of pillar bumps. The submount substrate 200 may include a plurality of CMOS cells corresponding to the plurality of LED cells, a plurality of individual electrodes 240 corresponding to the p-type electrode pads of the micro-LED, and a common electrode (not illustrated) corresponding to the n-type electrode pad of the micro-LED. The plurality of electrodes 240 of the submount substrate 200 are arranged in a matrix on a Si-based substrate material 201 and are connected to the CMOS cells. A passivation layer 250 is formed so as to cover the electrodes 240. The passivation layer 250 has holes 252 through which the individual electrodes 240 are exposed.

Figure 3:
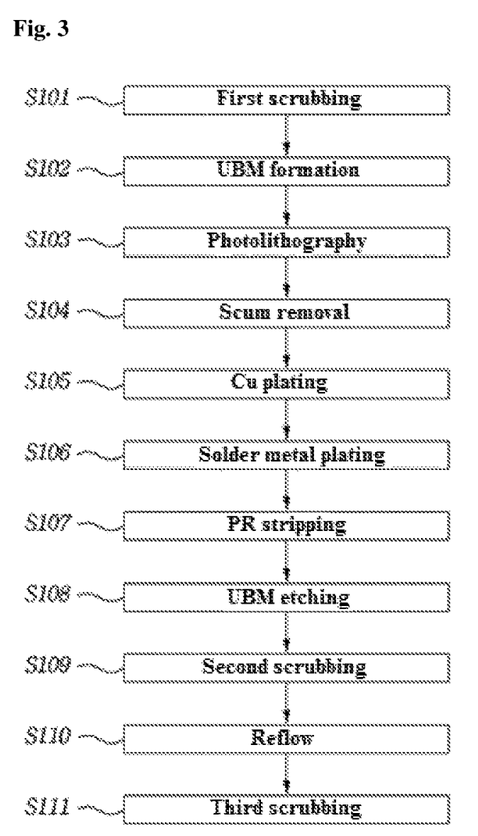
FIGS. 3 and 4 illustrate a process for forming bumps including solders on a submount substrate in accordance with a first embodiment of the present invention.
Figure 4:
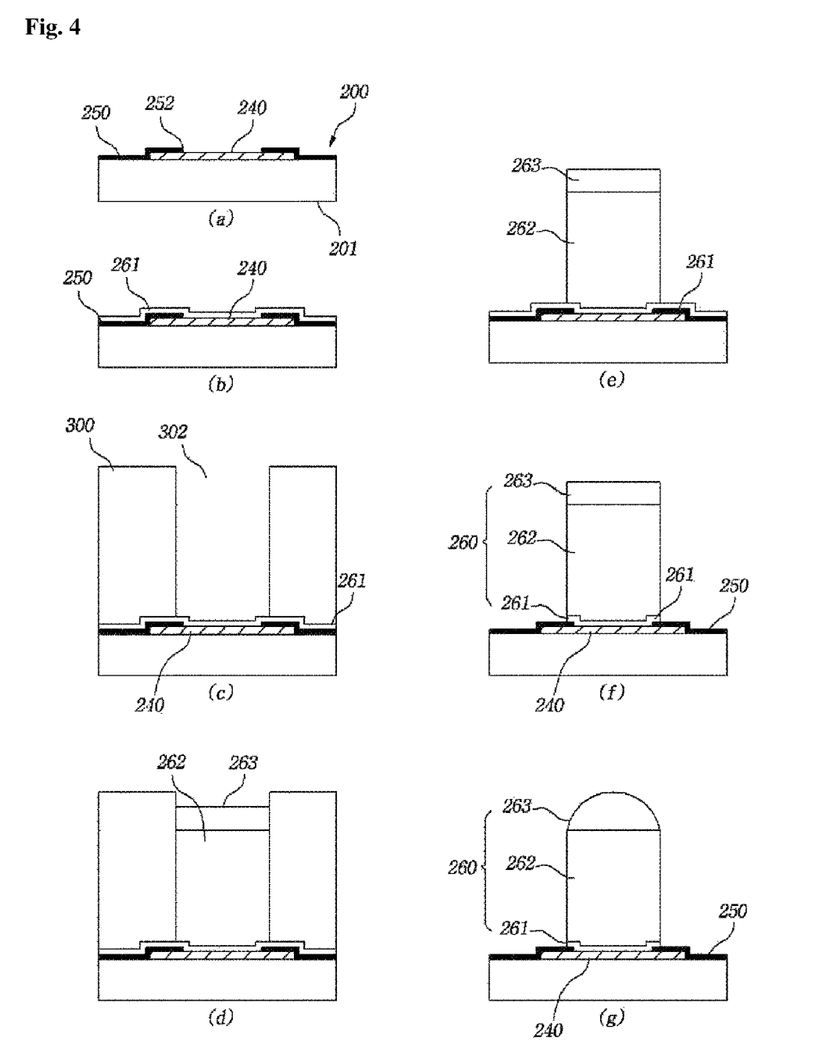

Referring to FIGS. 3 and 4, bumps are formed by a process including the following steps: first scrubbing S101, formation of an under bump metallurgy (UBM) S102, photolithography S103, scum removal S104, Cu plating S105, solder metal plating S106, PR stripping S107, UBM etching S108, second scrubbing S109, reflow S110, and third scrubbing S111.

In S101, a submount substrate 200 is scrubbed with a scrubber, as illustrated in (a) of FIG. 4. In the submount substrate 200, a pad-type electrode 240 made of an Al or Cu material is formed on a substrate material 201 including CMOS cells and a passivation layer 250 having a hole 252 is formed on the substrate material 201. The CMOS cells are formed by a CMOS process and one area of the electrode 240 is exposed through the hole 252.

In S102, a UBM 261 is formed on the submount substrate 200 to cover the passivation layer 250 and the electrode 240, as illustrated in (b) of FIG. 4. The UBM 261 serves to increase the adhesion of the electrode 240 to a Cu pillar and prevent a solder from diffusing. In this embodiment, the UBM 261 may have a layered structure of Ti/Cu and may be formed by sputtering the corresponding metals.

In S103, a photoresist (PR) 300 is formed over the entire area of the UBM 261 on the submount substrate 200, as illustrated in (c) of FIG. 4. Thereafter, a mask pattern is placed (not illustrated) on the photoresist and light is applied to form a hole 302 through which only one area of the UBM 261 formed directly on the electrode 240 is exposed. Next, S104 is carried out to remove scum formed during the photolithography.

Next, Cu is plated through the opening 302 of the PR 300 to form a Cu pillar 262 (S105) and then SnAg as a solder metal is plated on the Cu pillar 262 to form a SnAg solder cap 263 in the form of a layer with a predetermined thickness (S106), as illustrated in (d) of FIG. 4. It is noted herein that Cu may be Cu metal or its alloy.

Next, S107 is carried out to strip the PR. As a result, the upper and side surfaces of a bump including the Cu pillar 262 and the solder 263 are exposed, as illustrated in (e) of FIG. 4.

Next, UBM etching is performed such that only the portion of the UBM 261 located directly under the Cu pillar 262 remains unremoved and the other portions of the UBM 261 are removed by etching (S108), as illustrated in (f) of FIG. 4. Then, S109 is carried out to remove residue. After the UBM etching (S109), the resulting bump 260 has a structure in which the Cu pillar 262 and the solder cap 263 are sequentially stacked on the UBM 261 formed on the electrode 240 of the submount substrate 200. Next, reflow is performed (S110). As a result, the solder 263 in the form of a layer is melted and coagulated to form a hemisphere. Alternatively, the solder 263 may have a shape whose cross-section is semicircular. Rapid thermal processing (RTP) is suitable for this reflow. Next, third scrubbing is performed to remove residue (S111).

Preferably, the interval between the adjacent Cu pillar bumps 260 on the submount substrate 200 corresponds to the diameter of the Cu pillar 262. It is desirable that the interval between the adjacent Cu pillar bumps 260 does not exceed 5 μm. If the interval exceeds 5 μm, the diameter of the Cu pillar bumps 260 and the size of the resulting LED cells increase, resulting in a deterioration in the precision of a display including the micro-LED.

Flip-Bonding

Figure 5A:
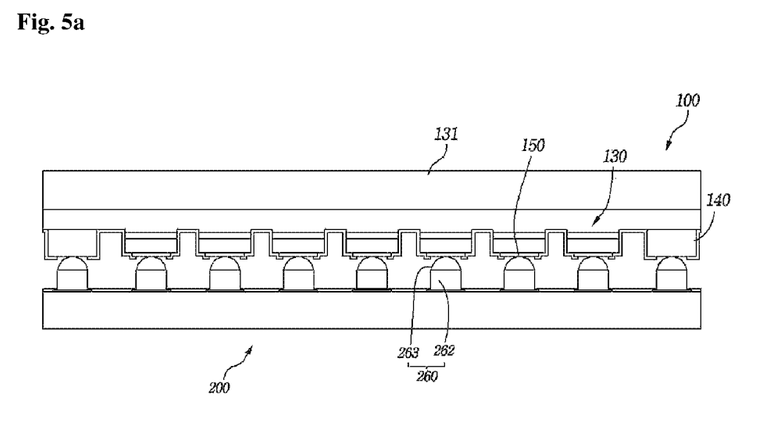
FIGS. 5a, 5b, and 5c illustrate a process for flip-bonding a micro-LED to a submount substrate.
Figure 5B:
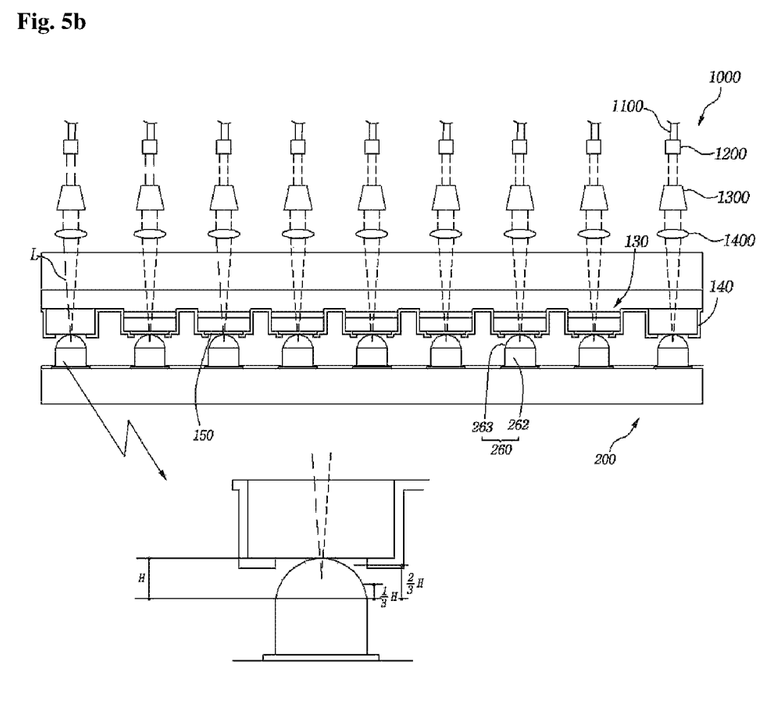
Figure 5C:
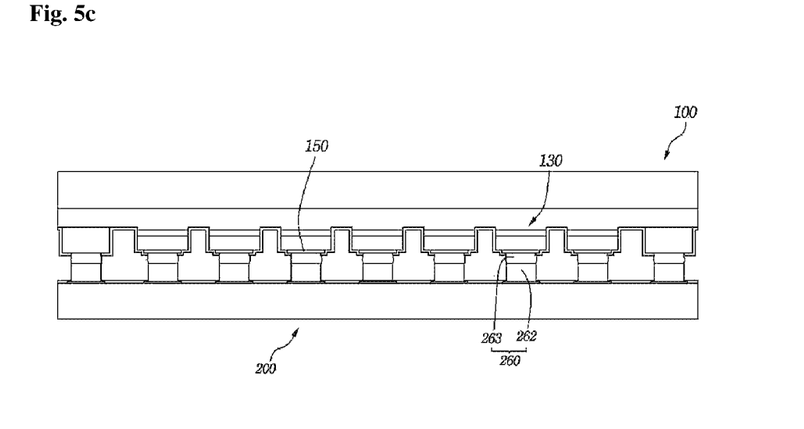

Referring to FIGS. 5a, 5b, and 5c, the micro-LED 100 based on the sapphire substrate 131 is flip-bonded to the submount substrate 200 based on the Si substrate material. The Si substrate material has a coefficient of thermal expansion of 2.6 $\mu mm^{-1}K$ and the sapphire substrate 131 has a coefficient of thermal expansion of 7.6 $\mu mm^{-1}K$, which is about 2.5-fold higher than that of the Si substrate material.

As mentioned earlier, the plurality of electrodes of the submount substrate 200 are disposed corresponding to the electrode pads 150 of the micro-LED 100. The bumps 260 are formed on the plurality of electrodes. Each of the bumps 260 consists of the Cu pillar 262 and the SnAg solder (i.e. solder cap 263). As mentioned briefly above, the LED cells 130 and the electrode pads 140 and 150 of the micro-LED 100 are transmissive to laser beams such that laser beams reach and locally heat the solders 263. For example, the electrode pads 140 and 150 are made of a conductive transparent metal compound through which laser beams can be transmitted.

After the solders 263 formed on the pillars 262 are located between the electrode pads 140 and 150 of the micro-LED 100 and the electrodes of the submount substrate 200, local heating of the solders 263 by laser beams allows the electrode pads 140 and 150 of the micro-LED 100 to be bonded to the electrodes of the submount substrate 200. This bonding will be explained in detail below.

The micro-LED 100 is flip-bonded to the submount substrate 200 using laser beams. To this end, first, it is necessary to arrange the individual electrode pads 150 disposed on the LED cells 130 of the micro-LED 100 and the common electrode pad 140 disposed at the periphery of the micro-LED 100 to face the electrodes of the submount substrate 200 and locate the solders 263 or the bumps 260 including the solders 263 between the electrodes of the submount substrate 200 and the electrode pads of the micro-LED 100. Thus, the plurality of solders 263 are located in an arrangement corresponding to that of the plurality of electrode pads 140 and 150 between the micro-LED 100 and the submount substrate 200.

Next, a plurality of laser beam irradiation units 1000 are placed in the same arrangement as that of the solders 263 at the upper side of the micro-LED 100. Each of the laser beam irradiation units 1000 includes an optical guide 1100 connected to a laser source, a collimator 1200 for making laser beams entering through the optical guide parallel to each other, a beam controller 1300 for controlling the cross-sectional size of the parallel laser beams, and a focusing lens 1400 for focusing the parallel laser beams whose cross-sectional size is controlled on one point. Although not illustrated, each of the laser beam irradiation units 1000 may further include a laser amplifier, an optical coupler, and a laser oscillation controller. The power of the laser beams is appropriately selected depending on the melting point of the soldering material.

The plurality of laser beam irradiation units 1000 may be operated simultaneously. In this case, laser beams L are supplied to the collimators 1200 through the optical guides 1100, the collimators 1200 make the laser beams parallel to each other and output the parallel laser beams, the beam controllers 1300 extend the diameter of the parallel laser beams, and the focusing lenses 1400 allow the parallel laser beams whose diameter is extended to pass through the micro-LED 100 and to be focused on the solders 263 in contact with the corresponding electrode pads 140 and 150 of the micro-LED 100. As a consequence, the solders 263 focused by the laser beams L are heated and melted. Since the laser beams pass through the micro-LED 100 without being focused on the micro-LED 100, the effect of the laser beams L to heat the micro-LED 100 is negligible. Thus, no thermal expansion and contraction occurs in the micro-LED 100. After being rapidly heated by the laser beams L, the solders 263 are cooled and hardened to bond the electrode pads 140 and 150 of the micro-LED 100 to the electrodes of the submount substrate 200. It is preferred that the focusing position of the laser beams L is determined between one and two-third of the height of the corresponding solder before melting. If the focusing position of the laser beam L exceeds two-third of the height of the solder (that is, it is close to the micro-LED 100), the LED cell 130 and the electrode pad 140 or 150 may be thermally damaged. Meanwhile, if the focusing position of the laser beam L is less than one-third of the height of the solder, there is a high risk that a circuit of the submount substrate 200 may be thermally damaged.

Alternative Example

Figure 6:
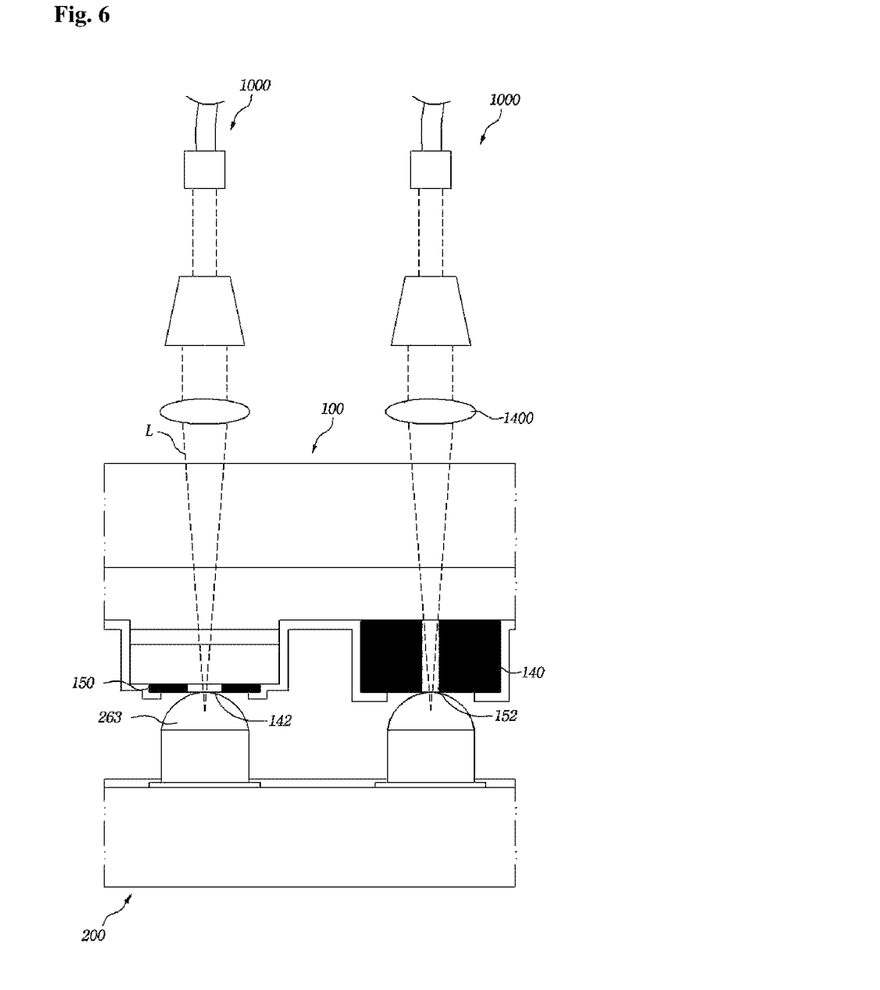
FIG. 6 illustrates an alternative example of a first embodiment of the present invention.

Alternatively, the electrode pads 140 and 150 may be made of a material non-transmissive to the laser beams L and may have cavities 142 and 152 through which the laser beams L can pass, respectively, as illustrated in FIG. 6a. Each of the cavities 142 and 152 is in contact with the laser beam-transmitting LED cell 130 of the micro-LED 100 at one side thereof and is open toward the corresponding solder 263 arranged between the submount substrate 200 and the micro-LED 100. When the laser beam irradiation units 1000 are operated, the laser beams L sequentially pass through the focusing lenses 1400, the micro-LED 100, and the cavities 142 and 152 of the electrode pads 140 and 150 and reach and are focused on the solders 263. The solders 263 are hardened to connect the electrode pads of the micro-LED 100 to the electrodes (or the pillars formed on the electrodes) of the submount substrate 200, after being melted by the laser beams. The molten solders 263 fill the cavities 142 and 152, enabling more reliable bonding between the electrode pads and the electrodes.

Other Examples

Figure 7:
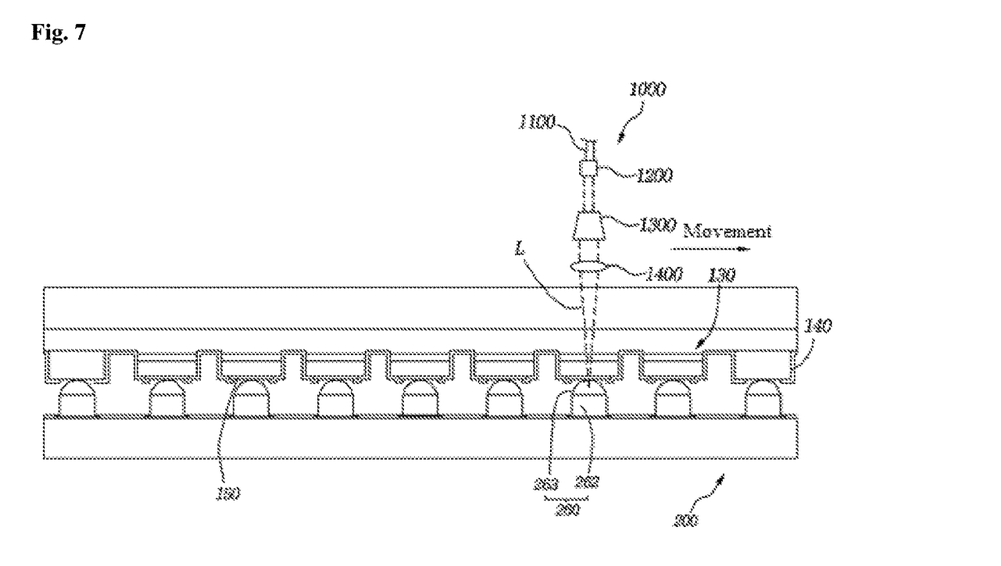
FIGS. 7 and 8 illustrate other examples of a first embodiment of the present invention.

As explained in the foregoing example, the plurality of laser beam irradiation units 1000 are matched to the plurality of solders in a 1:1 ratio such that a plurality of laser beams L irradiated from the plurality of laser beam irradiation units 1000 heat the solders in a 1:1 ratio. Other examples of the present invention are illustrated in FIG. 7. Referring to FIG. 7, each of the laser beam irradiation units 1000 can participate in heating several solders while moving in a certain direction. That is, each of the laser beam irradiation units 1000 may participate in heating two or more solders in a 1:n (where n is a natural number equal to or greater than 2) ratio.

Figure 8:
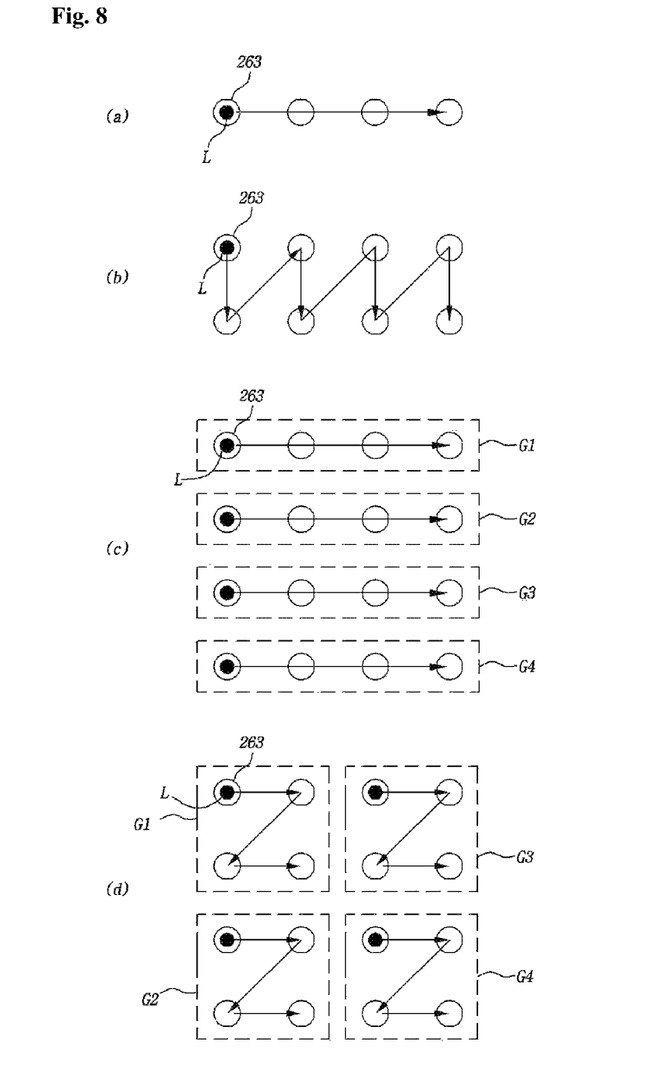

FIG. 8 illustrates examples of using the laser beam irradiation units whose number is smaller than that of the solders. For example, each of the laser beam irradiation units may heat several solders 263 in a linear ((a) of FIG. 8) or zigzag pattern ((b) of FIG. 8). Alternatively, several laser beams L1, L2, L3, and L4 may heat the solders 263 arranged in groups G1, G2, G3, and G4, as illustrated in (c) and (d) of FIG. 8. The laser beam irradiation units may heat the solder groups while moving in various patterns other than the linear ((c) of FIG. 8) or zigzag pattern ((d) of FIG. 8).

As described before, it should be understood that flip-bonding can be performed by matching the plurality of the laser beam irradiation units to the plurality of the solders in a 1:1 ratio such that laser beams irradiated from each of the plurality of laser beam irradiation units heat the corresponding solder, by matching the laser beam irradiation units to the plurality of solders in a 1:n (where n is a natural number equal to or greater than 2) ratio such that laser beams irradiated from each of the laser beam irradiation units heat two or more solders while the laser beam irradiation unit moves in a linear or zigzag pattern, or by matching two or more laser beam irradiation units to two or more groups of the solders such that each of the laser beam irradiation units heats the solders in the corresponding solder group.

Particularly, the flip-bonding based on the heating of the solders arranged in groups can provide a solution to the problems of low economic efficiency and inefficient work space utilization encountered when laser beams are matched to solders in a 1:1 ratio and the problem of long heating and cooling time encountered when one laser beam irradiation unit is used to heat all solders.

Although the foregoing examples have been explained based on the heating of the solders by laser beams passing through the micro-LED including the sapphire substrate, it is noted that soldering can be performed by irradiating laser beams onto the solders through the laser beam-transmitting submount substrate.

Second Embodiment

Construction of Micro-LED

A micro-LED is constructed by substantially the same process as explained with reference to FIGS. 1a to 1e.

Preparation of Submount Substrate and Formation of Bumps

A submount substrate is prepared and bumps are formed by substantially the same processes as explained with reference to FIGS. 3 and 4.

Flip-Bonding

Figure 9:
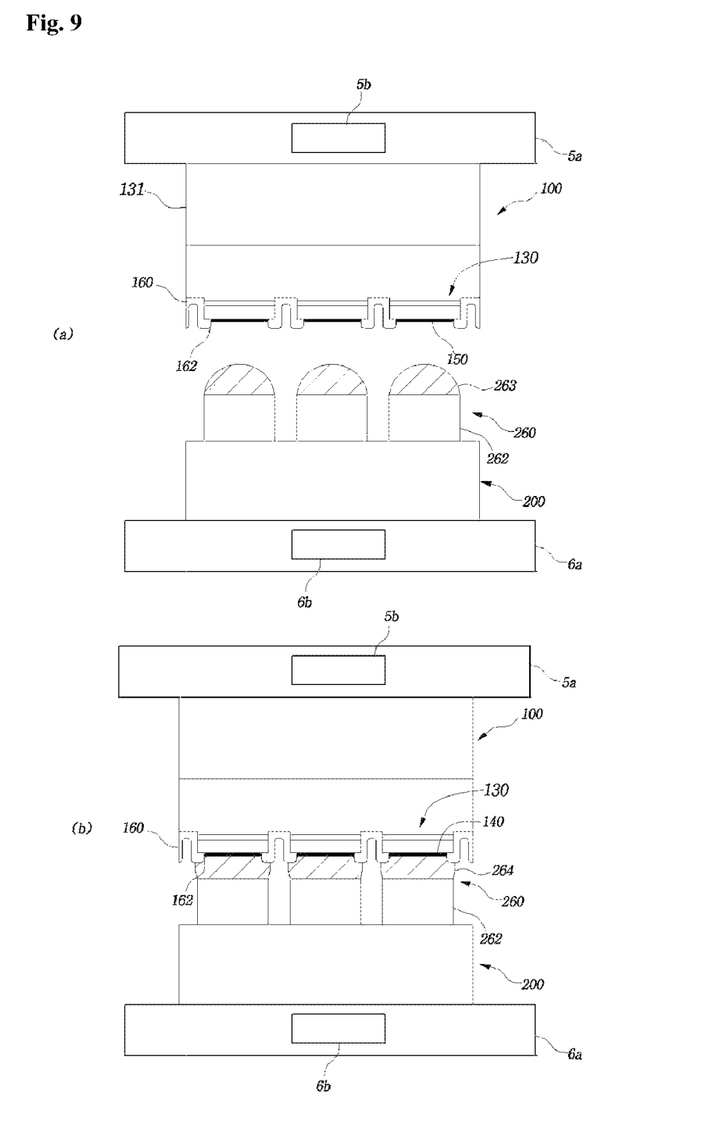
FIG. 9 illustrates a process for flip-bonding a micro-LED to a submount substrate in accordance with a second embodiment of the present invention.

As illustrated in (a) and (b) of FIG. 9, the micro-LED 100 based on a sapphire substrate 131 is flip-bonded to the submount substrate 200 based on a Si substrate material. The Si substrate material has a coefficient of thermal expansion of 2.6 $\mu mm^{-1}K$ and the sapphire substrate 131 has a coefficient of thermal expansion of 7.6 $\mu mm^{-1}K$, which is about 2.5-fold higher than that of the Si substrate material.

As mentioned earlier, the submount substrate 200 includes a plurality of electrodes disposed corresponding to electrode pads 150 of the micro-LED 100. The bumps 260 are formed on the plurality of electrodes. Each of the bumps 260 consists of a Cu pillar 262 and a SnAg solder (i.e. solder cap 263).

The micro-LED 100 is flip-bonded to the submount substrate 200 through the bumps so that the electrode pads 150 of the micro-LED 100 are connected to the electrodes of the submount substrate 200.

For flip-bonding of the micro-LED 100 to the submount substrate 200, a solder constituting at least a portion of each solder bump 260 should be heated to a temperature around its melting point. However, in the case where a conventional flip-bonding process is performed without controlling the temperatures of the micro-LED 100 and the submount substrate 200, a difference in strain between the Si-based submount substrate 200 and the sapphire substrate 131 is observed because the coefficient of thermal expansion of the Si-based submount substrate 200 is significantly different from that of the sapphire substrate 131 of the micro-LED 100, leading to a severe misalignment between the submount substrate 200 and the micro-LED 100 flip-bonded thereto. The coefficient of thermal expansion of the sapphire substrate amounts to about 2.5-fold higher than that of the Si-based submount substrate. The present invention is preferably used for flip-bonding between two substrates that are different by a factor of 2 in coefficient of thermal expansion.

For instance, when it is desired to flip-bond the micro-LED 100 based on the 1-cm long sapphire substrate 131 to the 1-cm long Si-based submount substrate 200 at 250° C. at which the solders are melted, the submount substrate 200 is lengthened by 5.85 μm due to the coefficient of thermal expansion of Si and the light-transmitting sapphire substrate 131 of the micro-LED 100 is lengthened by 17.1 μm due to the coefficient of thermal expansion of sapphire. That is, the difference in length between the two substrates is 11.25 μm during bonding. As a consequence, this length difference causes a severe cell misalignment.

In an attempt to solve the problem of cell misalignment, the present invention takes into consideration the coefficient of thermal expansion of the Si-based submount substrate 200 including a drive IC and a circuit and the coefficient of thermal expansion of the sapphire substrate 131. Based on this consideration, the micro-LED 100 is flip-bonded to the submount substrate 200 by heating the solders 263 between the micro-LED 100 and the submount substrate 200, more specifically, the solder 263 of the bumps 260 interposed between the electrode pads 150 formed on the LED cells 130 of the micro-LED 100 and the submount substrate 200 while controlling the temperatures of the Si-based sapphire substrate 200 and the sapphire substrate 131 to different values.

The temperature of the sapphire substrate 131 is controlled by a first temperature control unit 5b mounted on a first chuck 5a in face-to-face contact with the light-transmitting sapphire substrate 131 to support the micro-LED 100 and the temperature of the Si-based submount substrate 200 is controlled by a second temperature control unit 6b mounted on a second chuck 6a to support the submount substrate 200.

Figure 10:
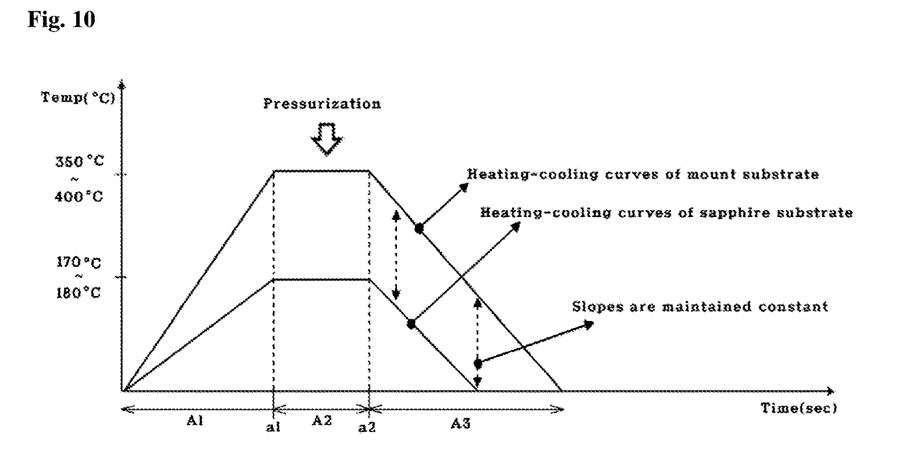
FIG. 10 shows heating-cooling curves of the micro-LED and the submount substrate during the flip-bonding process illustrated in FIG. 9.

The temperatures of the submount substrate 200 and the sapphire substrate 131 of the micro-LED 100 are controlled to different values in a heating zone A1, a holding zone A2, and a cooling zone A3 during flip-bonding, as best illustrated in FIG. 10.

In the heating zone A1, the temperature of the light-transmitting sapphire substrate 131 is allowed to rise linearly along a first heating curve from room temperature to a first holding temperature (~170-180° C.) by the first temperature control unit 5b mounted on the first chuck 5a and the temperature of the Si-based submount substrate 200 is allowed to rise linearly along a second heating curve from room temperature to a second holding temperature (~350-400° C.) by the second temperature control unit 6b mounted on the second chuck 6a.

In the holding zone A2, a vertical force is applied to pressurize the submount substrate 200 and the micro-LED 100 between which the molten solders 264 are interposed, the sapphire substrate 131 is maintained at the first holding temperature (125° C.) for the indicated time, and the Si-based submount substrate 200 is maintained at the second holding temperature (260° C.) for the indicated time.

In the holding zone, the sapphire substrate 131 and the submount substrate 200 begin to maintain their temperatures at the same point a1 and finish to maintain their temperatures at the same point a2.

In the cooling zone A3, the light-transmitting sapphire substrate 131 is cooled from the first holding temperature to room temperature and the Si-based submount substrate 200 is cooled from the second holding temperature to room temperature. In the cooling zone A3, it is preferred that the cooling curve of the sapphire substrate 131 is the same as that of the Si-based submount substrate 200. Thus, in the cooling zone, the time when the cooling of the light-transmitting sapphire substrate 131 to room temperature is completed is earlier than the time when the cooling of the submount substrate 200 to room temperature is completed.

If the cooling curve of the light-transmitting sapphire substrate 131 is made excessively different from that of the submount substrate 200 in order to complete the cooling of the sapphire substrate 131 and the submount substrate 200 at the same time point, a significant difference in shrinkage strain between the sapphire substrate 131 and the submount substrate 200 is observed, and as a result, the solder connections are cut and the LED cells are misaligned.

What is claimed is:

1. A method for fabricating a micro-LED module comprising:
   preparing a micro-LED comprising a plurality of electrode pads and a plurality of LED cells;
   preparing a submount substrate comprising a plurality of electrodes corresponding to the plurality of electrode pads; and
   flip-bonding the micro-LED to the submount substrate through a plurality of solders located between the plurality of electrode pads and the plurality of electrodes,
   wherein the micro-LED comprises a substrate and an epilayer comprising the LED cells,
   wherein the flip-bonding comprises heating the plurality of solders by a plurality of laser beams passing vertically through the micro-LED from one side to the other side of the micro-LED, and the plurality of laser beams comprise laser beams passing through the substrate and the epilayer in which none of the LED cells are present and laser beams passing through the substrate and the epilayer in which the LED cells are present.

2. The method according to claim 1, wherein the individual electrode pads are formed on the LED cells and the flip-bonding comprises heating the solders located between the individual electrode pads and the submount substrate by the plurality of laser beams sequentially passing through the LED cells and the individual electrode pads.

3. The method according to claim 2, wherein the individual electrode pads are transmissive to the plurality of laser beams.

4. The method according to claim 2, wherein the individual electrode pads comprise cavities through which the plurality of laser beams pass.

5. The method according to claim 1, wherein the micro-LED comprises a common electrode pad formed on the surface of the epilayer around the plurality of LED cells and the flip-bonding comprises heating the solder located between the common electrode pad and the submount substrate by the plurality of laser beams sequentially passing through the epilayer and the common electrode pad.

6. The method according to claim 5, wherein the common electrode pad is transmissive to the plurality of laser beams.

7. The method according to claim 5, wherein the common electrode pad comprises a cavity through which the plurality of laser beams pass.

8. The method according to claim 1, further comprising focusing the laser beams on the corresponding solders by focusing lenses.

9. The method according to claim 1, wherein the flip-bonding comprises placing a plurality of laser beam irradiation units in an arrangement corresponding to an arrangement of the plurality of solders at one side of the micro-LED before heating the plurality of solders by the plurality of laser beams passing vertically through the micro-LED from one side to the other side of the micro-LED.

10. The method according to claim 1, wherein a plurality of laser beam irradiation units are placed in an arrangement corresponding to an arrangement of the plurality of solders at one side of the micro-LED before heating the plurality of solders by the plurality of laser beams passing vertically through the micro-LED from one side to the other side of the micro-LED and each of the plurality of laser beam irradiation units comprises an optical guide connected to a laser source, a collimator for making laser beams entering through the optical guide parallel to each other, a beam controller for controlling the cross-sectional size of the parallel laser beams, and a focusing lens for focusing the parallel laser beams whose cross-sectional size is controlled on the corresponding solders.

11. The method according to claim 1, wherein the flip-bonding comprises matching the plurality of solders to the plurality of laser beams in a 1:1 ratio such that the plurality of solders are heated by the plurality of laser beams.

12. The method according to claim 1, wherein the flip-bonding comprises matching a plurality of laser beam irradiation units to the plurality of solders in a 1:1 ratio such that the plurality of solders are heated by laser beams irradiated from the plurality of laser beam irradiation units.

13. The method according to claim 1, wherein the flip-bonding comprises matching a plurality of laser beam irradiation units to the plurality of solders in a 1:n (where n is a natural number equal to or greater than 2) ratio such that two or more of the solders are heated by laser beams irradiated from each of the laser beam irradiation units moving in a linear or zigzag pattern.

14. The method according to claim 1, wherein the flip-bonding comprises matching two or more laser beam irradiation units to two or more solder groups such that each of the laser beam irradiation units heats the solders in the corresponding solder group.

15. A micro-LED module comprising:
   a micro-LED comprising a substrate, an epilayer comprising a plurality of LED cells, second conductive individual electrode pads disposed on the plurality of LED cells, and a first conductive common electrode disposed around the plurality of LED cells;
   a submount substrate comprising a plurality of electrodes corresponding to the individual electrode pads and the common electrode pad; and
   solders located between the electrodes and the individual and common electrode pads,
   wherein the solders are heated by a plurality of laser beams and are then hardened so that the electrodes are connected to the individual electrode pads and the common electrode pad,
   wherein the plurality of laser beams comprise laser beams passing through the substrate and the epilayer in which none of the LED cells are present and laser beams passing through the substrate and the epilayer in which the LED cells are present.

16. The micro-LED module according to claim 15, wherein the substrate, the epilayer, the individual electrode pads, and the common electrode pad are transmissive to the laser beams such that the solders are heated by the laser beams passing through the micro-LED from one side to the other side of the micro-LED.

17. The micro-LED module according to claim 15, wherein the individual electrode pads are made of a laser beam-transmitting material.

18. The micro-LED module according to claim 15, wherein the individual electrode pads or the common electrode pad comprises cavities through which the laser beams pass.

* * * * *